United States Patent
Abali et al.

(10) Patent No.: US 11,216,212 B2
(45) Date of Patent: Jan. 4, 2022

(54) MINIMIZING CONFLICTS IN MULTIPORT BANKED MEMORY ARRAYS

(71) Applicant: INTERNATIONAL BUSINESS MACHINES CORPORATION, Armonk, NY (US)

(72) Inventors: Bulent Abali, Tenafly, NJ (US); Ashutosh Misra, Bangalore (IN); Hubertus Franke, Cortlandt Manor, NY (US); Matthias Klein, Poughkeepsie, NY (US); Deepankar Bhattacharjee, Bangalore (IN); Girish Kurup, Jagadishnagar (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/357,612

(22) Filed: Mar. 19, 2019

(65) Prior Publication Data
US 2020/0301604 A1 Sep. 24, 2020

(51) Int. Cl.
*G06F 3/06* (2006.01)

(52) U.S. Cl.
CPC .......... *G06F 3/0659* (2013.01); *G06F 3/0613* (2013.01); *G06F 3/0683* (2013.01)

(58) Field of Classification Search
None
See application file for complete search history.

(56) References Cited

U.S. PATENT DOCUMENTS

| | | | |
|---|---|---|---|
| 9,576,663 B1* | 2/2017 | Gazit | G11C 7/1075 |
| 2002/0065997 A1* | 5/2002 | Hsu | G06F 13/18 |
| | | | 711/158 |
| 2003/0005229 A1* | 1/2003 | Rangan | G06F 12/0857 |
| | | | 711/122 |
| 2004/0151197 A1* | 8/2004 | Hui | H04L 47/2416 |
| | | | 370/412 |
| 2005/0177689 A1* | 8/2005 | Leijten | G06F 13/161 |
| | | | 711/149 |
| 2009/0089551 A1 | 4/2009 | Min et al. | |
| 2009/0144509 A1* | 6/2009 | Wong | G06F 9/526 |
| | | | 711/147 |
| 2009/0150621 A1 | 6/2009 | Lee | |
| 2011/0225369 A1* | 9/2011 | Park | G06F 12/0846 |
| | | | 711/131 |
| 2011/0286463 A1* | 11/2011 | Tse | H04L 49/90 |
| | | | 370/400 |

(Continued)

OTHER PUBLICATIONS

Zhao, J., Mutlu, O., & Xie, Y. (2014). FIRM: Fair and high-performance memory control for persistent memory systems. Proceedings of the 47th Annual IEEE/ACM International Symposium on Microarchitecture, pp. 153-165.

(Continued)

*Primary Examiner* — Charles Rones
*Assistant Examiner* — Ryan Dare
(74) *Attorney, Agent, or Firm* — Griffiths & Seaton PLLC

(57) ABSTRACT

Various embodiments are provided for managing multiport banked memory arrays in a computing system by a processor. One or more conflicts may be eliminated in a multiport banked memory array upon receiving one or more write operations, read operations, or a combination thereof according to a selected priority and access protocol.

17 Claims, 15 Drawing Sheets

(56) References Cited

U.S. PATENT DOCUMENTS

2014/0177324 A1    6/2014   Liu et al.
2016/0239439 A1    8/2016   Lu
2016/0320989 A1   11/2016   Bromberg et al.
2018/0166128 A1    6/2018   Rawat et al.

OTHER PUBLICATIONS

Abdelhadi, A., & Lemieux, G. G. (2014). Modular multi-ported SRAM-based memories. Proceedings of the 2014 ACM/SIGDA international symposium on Field-programmable gate arrays, pp. 35-44.

\* cited by examiner

AVERAGE CYCLE TIME

| METHOD (16 BANKS, 8 REQUESTS/GROUP) | AVG. CYCLES/GROUP (1.0 = IDEAL) |
|---|---|
| NO QUEUE | 2.06 |
| 1 WIDE QUEUE, OUT-OF-ORDER | 1.16 |
| 2 WIDE QUEUE, OUT OF-ORDER | 1.02 |
| 1 WIDE QUEUE, MULTIPLEXED DATA BUS, OUT-OF-ORDER | 1.26 |
| 2 WIDE QUEUE, MULTIPLEXED DATA BUS, OUT-OF-ORDER | 1.12 |
| 1 WIDE QUEUE, MULTIPLEXED DATA BUS, IN-ORDER | 1.45 |

| METHOD (32 BANKS, 8 REQUESTS/GROUP) | AVG. CYCLES/GROUP (1.0 = IDEAL) |
|---|---|
| NO QUEUE | 1.66 |
| 1 WIDE QUEUE, OUT-OF-ORDER | 1.02 |
| 2 WIDE QUEUE, OUT OF-ORDER | 1.00 |
| 1 WIDE QUEUE, MULTIPLEXED DATA BUS, OUT-OF-ORDER | 1.09 |
| 2 WIDE QUEUE, MULTIPLEXED DATA BUS, OUT-OF-ORDER | 1.02 |
| 1 WIDE QUEUE, MULTIPLEXED DATA BUS, IN-ORDER | 1.20 |

FIG. 12

MINIMIZING CONFLICTS IN MULTIPORT BANKED MEMORY ARRAYS

BACKGROUND OF THE INVENTION

Field of the Invention

The present invention relates in general to computing systems, and more particularly to, various embodiments for minimizing conflicts in multiport banked memory arrays using one or more computing processors.

Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. Processing devices, with the advent and further miniaturization of integrated circuits, have made it possible to be integrated into a wide variety of devices. In recent years, both software and hardware technologies have experienced amazing advancement. With the new technology, more and more functions are added, and greater convenience is provided for use with these computing systems.

SUMMARY OF THE INVENTION

Various embodiments for managing and minimizing conflicts in multiport banked memory arrays by a processor are provided. Each storage block of a storage device associated with a queue may be split. One or more conflicts may be eliminated in a multiport banked memory array upon receiving one or more write operations, read operations, or a combination thereof according to a selected priority and access protocol.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 12 is a graph diagram depicting minimizing conflict in a multiport banked memory array using an arbiter and data router in a computing system in accordance with aspects of the present invention;

DETAILED DESCRIPTION OF THE DRAWINGS

Figure 1:
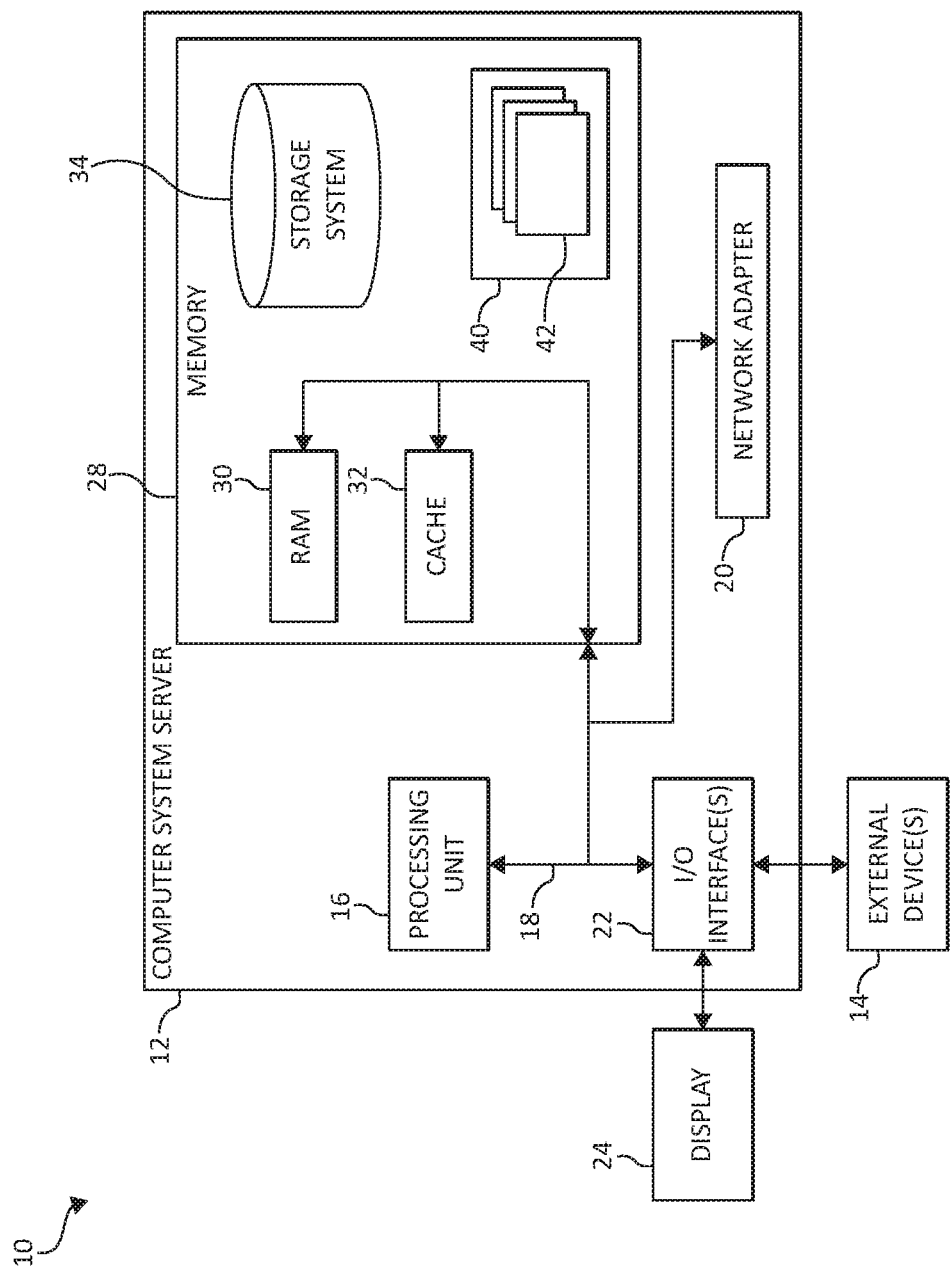
FIG. 1 is a block diagram depicting an exemplary cloud computing node according to an embodiment of the present invention.

Generally, electronic circuits have significant data storage capacities. Such capacities may be achieved with large memories formed of several memory blocks for physical or logical reasons. For example, such memories may include SRAM (Static Random-Access Memory) or DRAM (Dynamic Access Memory). A memory controller enables the other functions of the electronic circuit to view all the memory blocks as a single memory, in terms of address.

A multiple port memory comprises a plurality of ports. Such memory can be a RAM or SRAM. Multiple-port ("Multiport") memories (e.g., Multi-port RAMs) have been developed have been developed for high speed applications, such as real time signal processing or parallel data processing. Generally, each port represents an independent input and/or output path for writing data into the memory. A multiple port memory may, for example, comprise several write ports and read ports but the number of write ports need not to be the same as the number of read ports. A multiple-port memory may provide dual ports that provide the ability for independent read and write access paths to the memory. For example, the multiple-port memory may write data to the memory and/or read data from the memory on a first port while simultaneously writing alternative data to the memory on a second port and/or read alternative data from the memory on the second port.

However, a multiple-port memory may experience a bank conflict. A bank conflict, for example, may occur when requests to read from or write to a particular memory bank more than once during a designated period of time of the access to the shared memory. That is, a bank conflict may be a request for simultaneous read and write to the same memory bank. Said differently, a bank conflict exists if the read address and the write address both contain the same subset of lower address bits and there are concurrent read and write requests. Thus, when multiple addresses belonging to the same bank are accessed at the same time, it results in bank conflict. Bank conflicts may cause long delays and reduce computing efficiency.

Accordingly, the present invention provides a solution to minimize, reduce, and/or eliminate conflicts in multiport banked memory arrays in a computing system. One or more conflicts may be minimized, reduced, and/or eliminated in a multiport banked memory array upon receiving one or more write operations, read operations, or a combination thereof according to a selected priority and access protocol. That is, a selected priority and access protocol may be defined for accessing a multiport banked memory array. One or more write operations, read operations, or a combination thereof may be received in a multiport banked memory array. One or more conflicts may be eliminated in a multiport banked memory array upon receiving one or more write operations, read operations, or a combination thereof according to a selected priority and access protocol.

In an additional aspect, a multi-port banked memory array may serve N requests out of M banks in the multiport banked memory array with reduced bank collisions. Thus, the present invention relates to system microprocessors in which collisions in a banked array of SRAMs implementing a hash table are gating the performance. In one aspect, the present invention minimizes banked collisions without requiring additional or larger silicon area in the microprocessor. For example, the present invention may use one or more single-port SRAMs, resulting in less silicon area, less average write time, and high-write throughput compared to using area-consuming multi-port SRAMs. Furthermore, the present invention may delay one or more applications for write operations to the multiport memory without impeding overall performance. The present invention may also provide high throughput read operations when nondeterministic variable memory read latencies are permitted or when pipelined reads are permitted.

Moreover, the present invention may retry one or more failed writes until successful such as, for example, one or two retries on average (for some N, M) until successful. It should be noted that a retry operation for write failures have an increased probability of success using mechanisms of the illustrated embodiments. In a hash table application of the banked memory, one or more of the read or write requests may be dropped and/or queued thereby speeding up the operation without losing information. A speed and accuracy monitor (SAM) may determine when to drop read or write requests for access to memory and when to retry the read or write requests thereby trading off between performance and accuracy.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
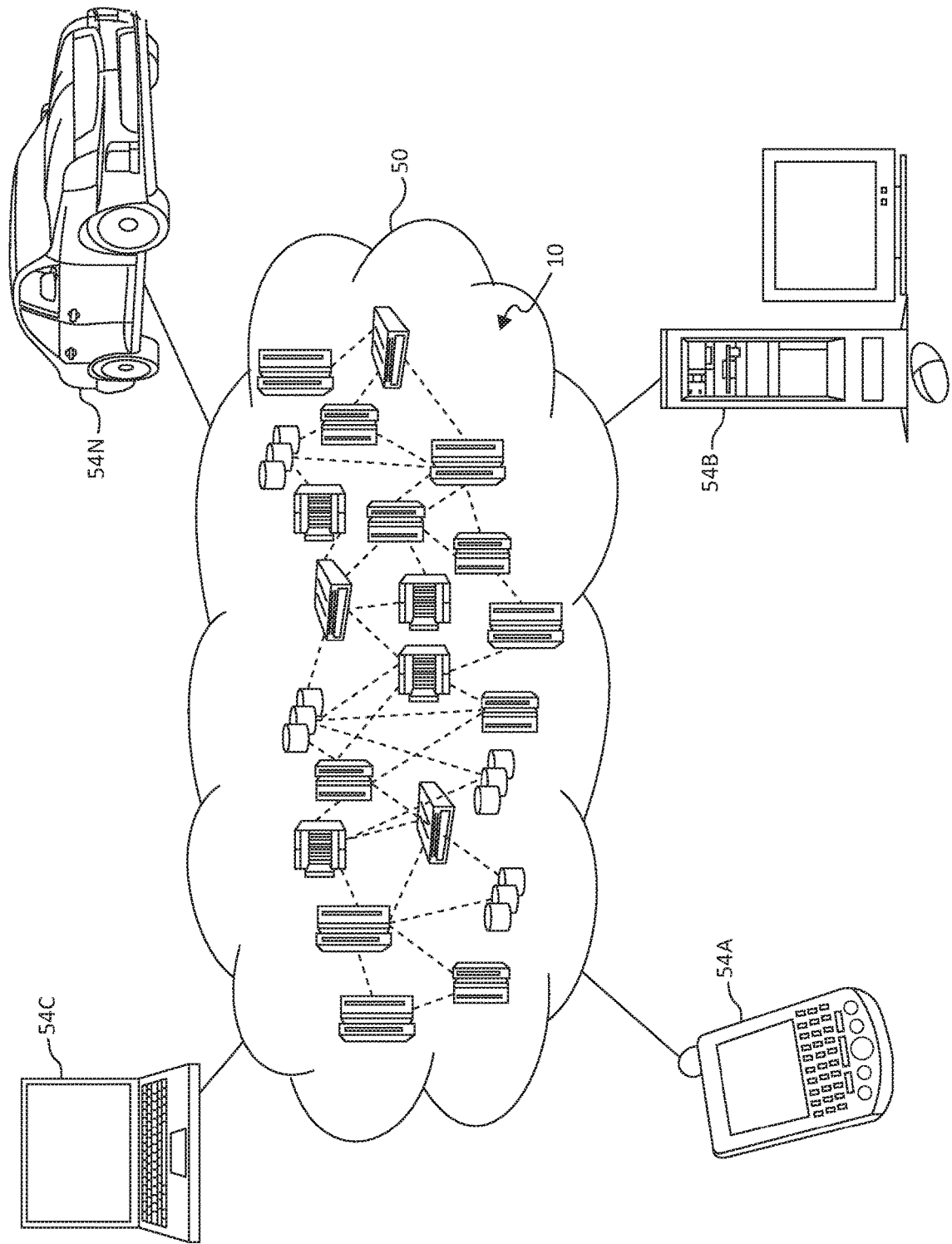
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
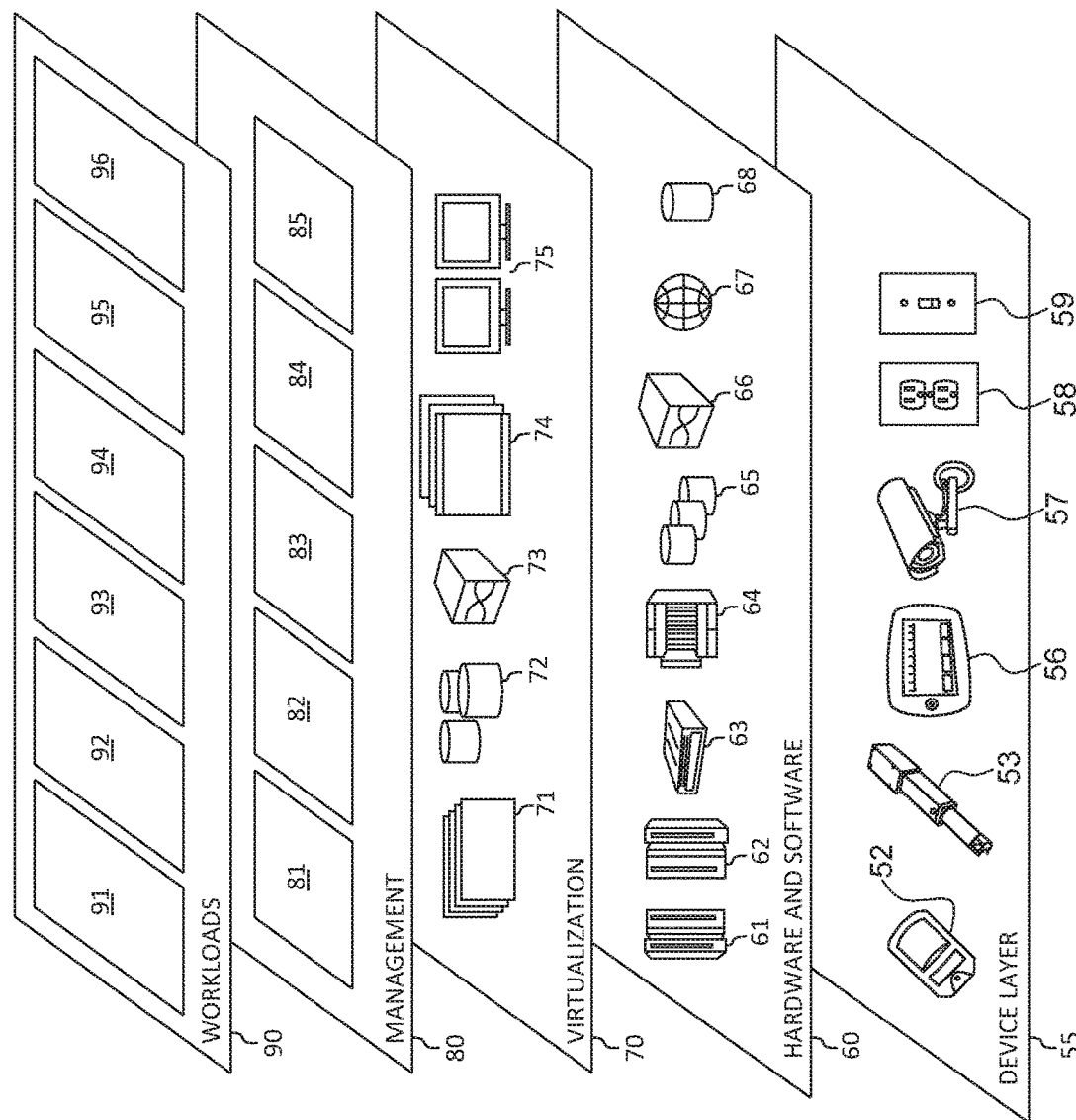
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for managing and minimizing conflicts in multiport banked memory arrays in a computing environment. In addition, workloads and functions 96 for managing and minimizing conflicts in multiport banked memory arrays in a computing environment may include such operations as data analysis (including data collection and processing from various environmental sensors) and/or analytics operations. One of ordinary skill in the art will appreciate that the workloads and functions 96 for managing and minimizing conflicts in multiport banked memory arrays in a computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

Figure 4:
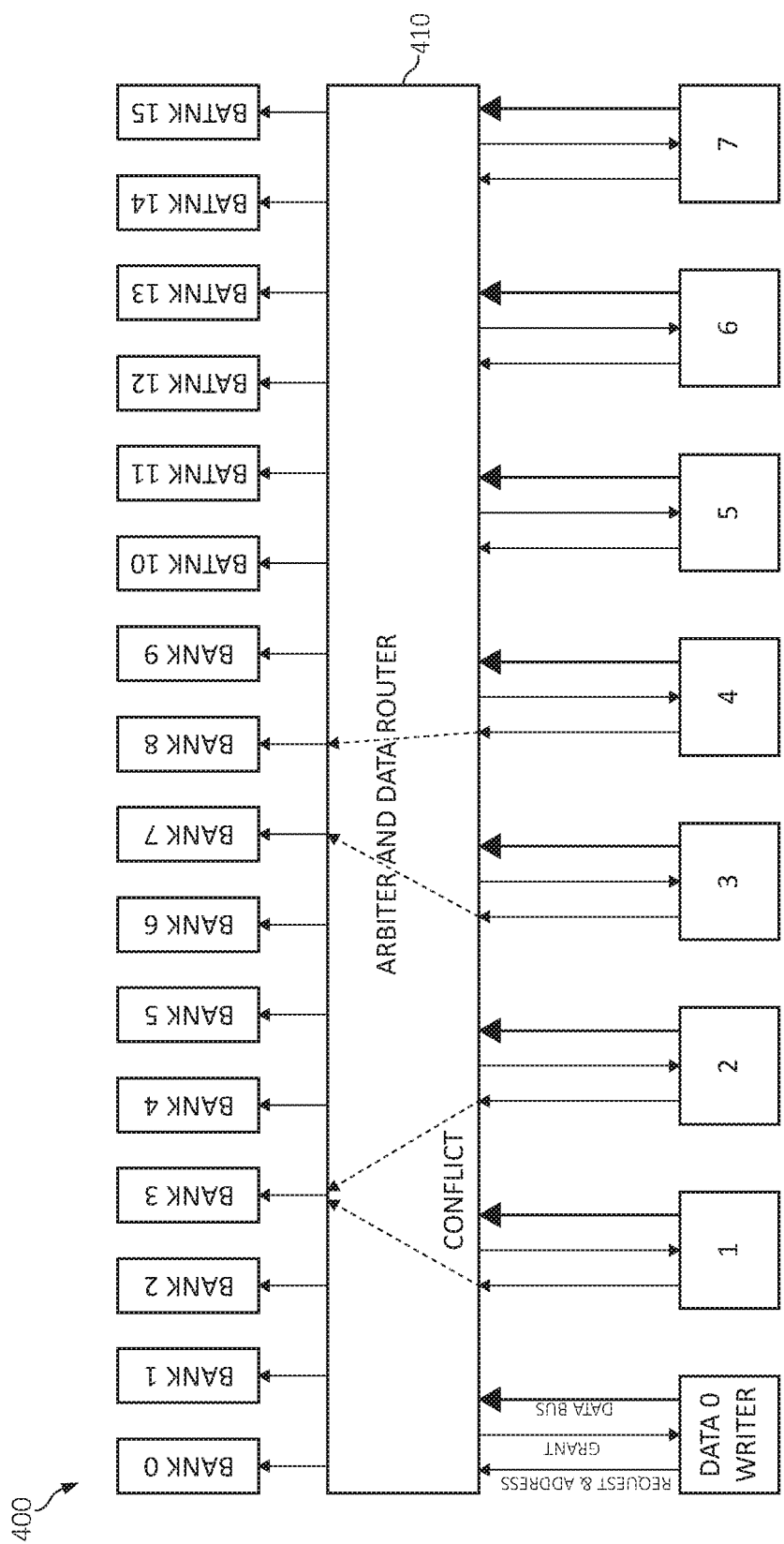
FIG. 4 is an additional block diagram depicting a multiport banked memory array in which aspects of the present invention may be realized.

As previously mentioned, the mechanisms of the illustrated embodiments provide novel approaches for managing and minimizing conflicts in multiport banked memory arrays in a computing environment. Turning now to FIG. 4, a multiport banked memory array system 400 is depicted having a memory bank (e.g., memory banks ("banks") 0 through 15), an arbiter and data router 410 and one or more data writer such as, for example, data writers 0 through 7. In one aspect, the banks 0 through 15 may be SRAM memory. In one aspect, one or more of the components, modules, services, applications, and/or functions described in FIGS. 1-3 may be used in FIG. 4. For example, the system 400 may be components internal and/or external to computer system/server 12.

More specifically, banks 0 through bank 15 are 16 banks of SRAM and are shared between eight data writers (e.g., data writers/memory ports 0 through 7 and/or a writer uses a memory port to write the data to the memory) that may simultaneously write to their respective locations in lock step. In one aspect, the data writers (e.g., data writers 0 through 7) may be independent from memory ports. Each bank (e.g., banks 0 through bank 15) may have memory ports, and an arbiter (e.g., data router 410) decides whether there is any conflict of address and only 1 request is allowed by the data router 410 to write to data writers/memory ports 0 through 7 for each bank.

In one aspect, the multiport memory (e.g., banks 0-15) is logically a single memory. Addresses may be distributed among the SRAM banks and SRAM locations according to a mapping, interleaved, contiguous or any other defined mapping configuration. For example, as illustrated in FIG. 4, each data unit (e.g., file) may be 144 bits wide, and memory address is 11 bits wide. Each SRAM (e.g., banks 0-15) may have 128 entries (e.g., 16 SRAM×128 entry/SRAM=2048 total entries).

In one aspect, the SRAMS (e.g., banks 0-15) are unable to have more than eight read ports or eight write ports, because the SRAMS would be too expensive to implement. The SRAM number of ports may be referred to as "xRyW" such as, for example, 1R1W refers to an SRAM with 1 read and 1 write port. That is, a multiple-port memory may be a two-port memory, such as a single-port read, single-port write (1R1W) memory, which has a read port and a write port.

Alternatively, a dual-port read, single-port write ("2R1W") and dual-port read, dual-port write ("2R2W") may also be used, but use larger area, which may be twice as large than a similar capacity 1R1W SRAM. Thus, the present invention may use a banked memory designs which may comprise multiple 1R1W SRAMS. One advantage of the banked memory of system 400 of FIG. 4 is logically implementing high port counts using 1R1W SRAMS such as, for example, the 8 write port memories. However, the disadvantage of the banked memory of system 400 is the occurrences of bank conflicts: when two or more access requests via the arbiter and data router 410 are made to the same SRAM (e.g., bank 3) then the request cannot be satisfied using 1R1W SRAM. For example, assume memory ports 1 and 2 both want to write to bank 3 in the same processor cycle. However, because of the conflict, memory ports 1 and 2 must take turns therefore accomplishing the task in 2 processor cycles instead.

Figure 5:
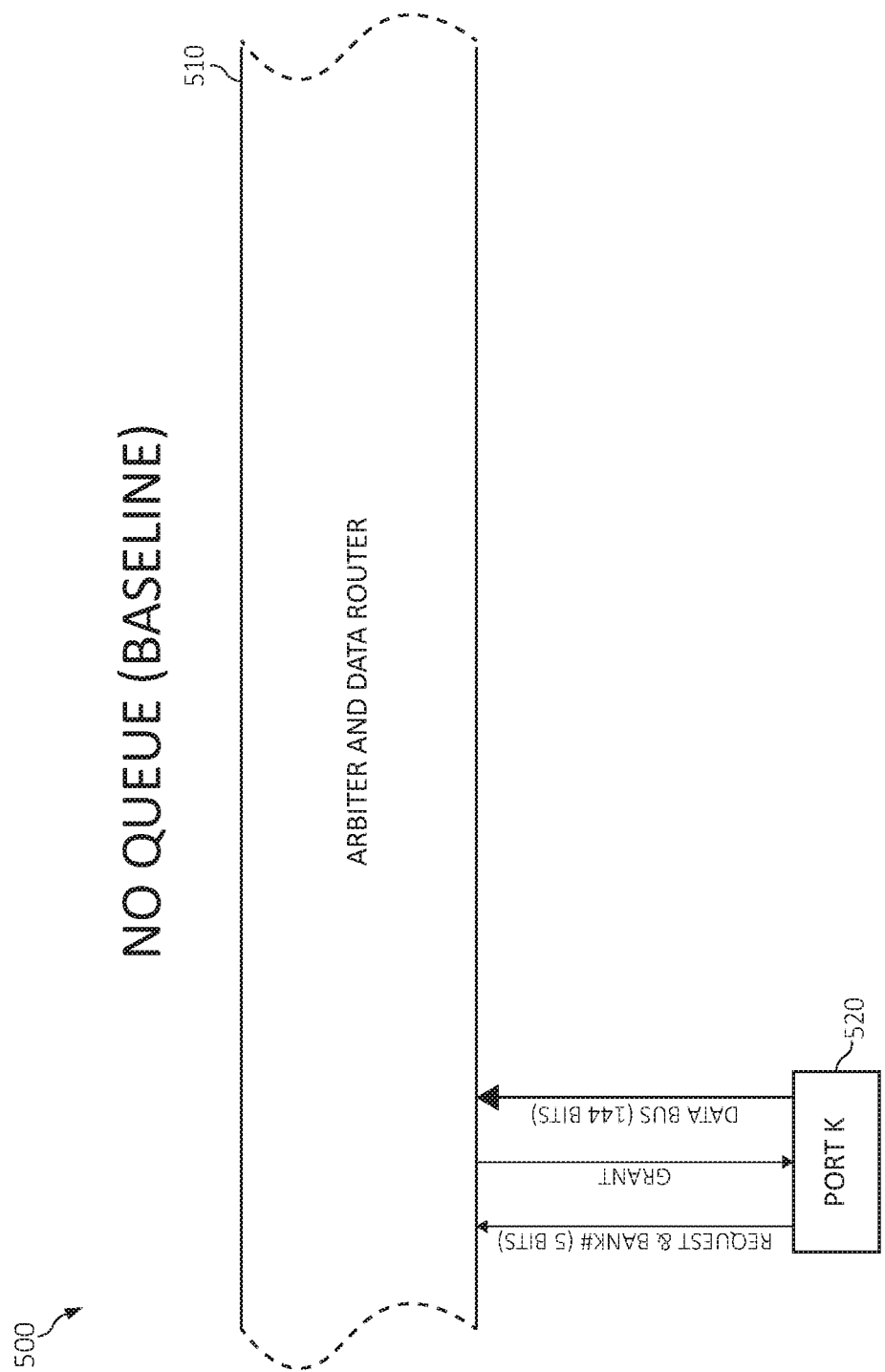
FIG. 5 is an additional block diagram depicting a multiport banked memory array using an arbiter and data router without a queue in which aspects of the present invention may be realized.

To address the disadvantage of FIG. 4, FIG. 5 is a diagram 500 illustrating use of an arbiter and data router 510 without a queue in a multiport banked memory array such as, for example, the multiport banked memory array 400 of FIG. 4. Repetitive description of like elements, components, modules, services, applications, and/or functions employed in other embodiments described herein (e.g., FIGS. 1-4) is omitted for sake of brevity.

In one aspect, an arbiter and router 510 in the middle services may access requests (e.g., request & bank # "5 bits") without using a queue (e.g., a queue component). That is, the arbiter and router 510 may determine a next command to be sent to the multiport banked memory array 400 of FIG. 4. That is, the arbiter and data router 510 may follow and/or adhere to a selected priority and access protocol and prioritize and select which memory that port K 520 can write to and which bank B can be select in a selected cycle (e.g., a processor cycle). In one aspect, the arbiter and router 510 may forward the writer's data bits to the selected bank B.

Figure 6:
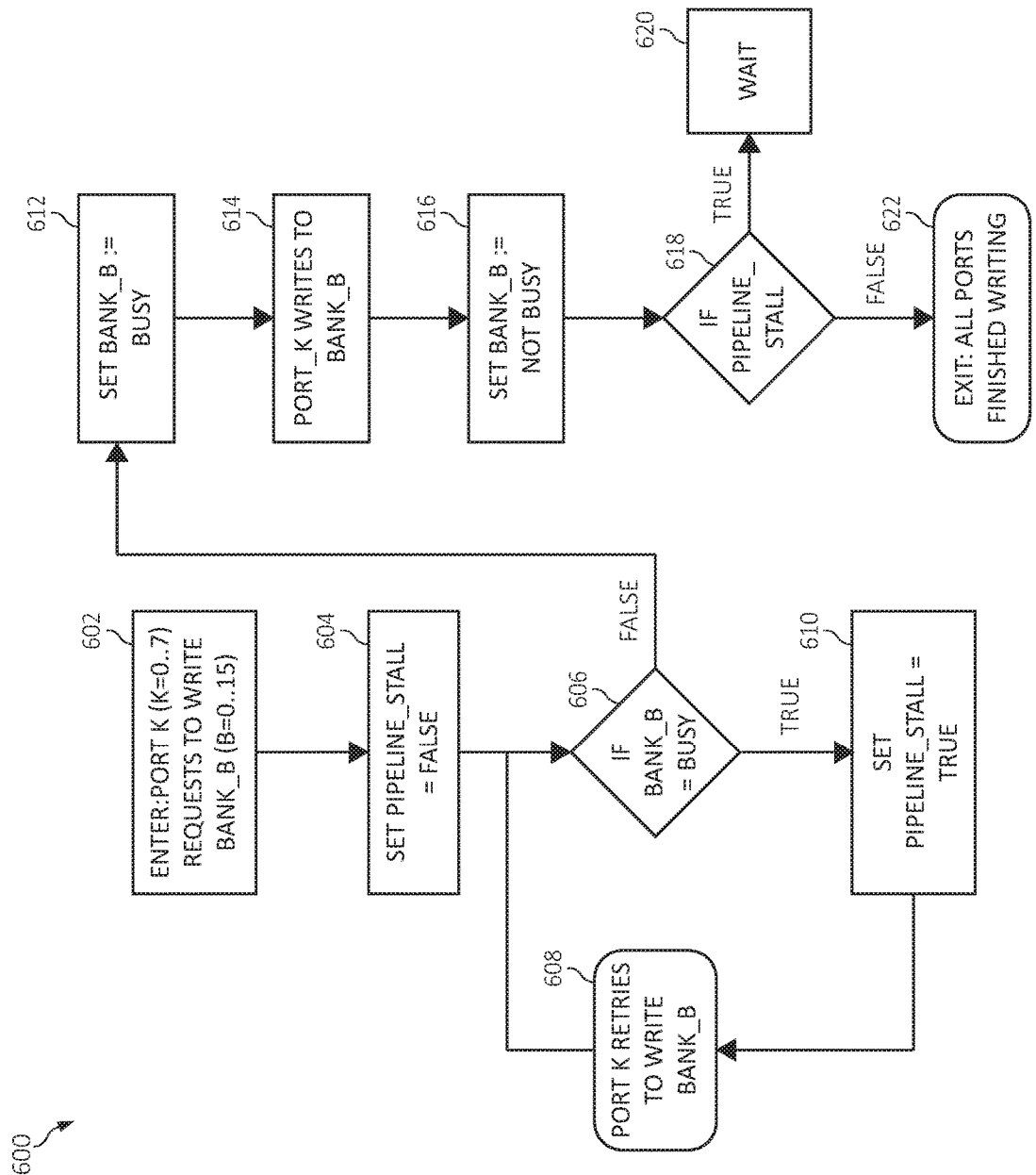
FIG. 6 is a flowchart diagram depicting an exemplary method for prioritizing access requests in a multiport banked memory array using an arbiter and data router in a computing system in which aspects of the present invention may be realized.

Turning now to FIG. 6, a flowchart diagram depicts an exemplary method 600 for prioritizing access requests in a multiport banked memory array using an arbiter and data router in a computing system. The functionality 600 may be implemented as a method executed as instructions on a machine, where the instructions are included on at least one computer readable medium or on a non-transitory machine-readable storage medium.

The functionality 600 may start in block 602 by receiving a request to write to a selected memory bank (e.g., port K where K is equal to 0 through 7) and requests access to bank B (e.g., where B is equal to 0 through 15 such as in FIGS. 4 and 5). A pipeline stall may be set as "false," as in block 604, which is to make sure, that the flag "SET_PIPELINE_STALL" is reset to false after setting it to true.

A determination operation is performed to determine if the selected memory bank (e.g., bank B) is busy/unavailable, as in block 606. If yes, the method 600 moves to block 610 and the pipeline stall may be set as true (e.g., busy/unavailable). From block 610, the memory port (e.g., port K) attempts to retry to write to the selected memory bank (e.g., bank B) for a selected number of cycles, as in block 608. From block 608, the method 600 moves back to block 606.

If no (e.g., false) at block 606, the selected memory bank (e.g., bank B) may be set as busy/unavailable, as in block 612. At block 614, the memory port (e.g., port K) may write to the selected memory bank (e.g., bank B). At block 616, the selected memory bank (e.g., bank B) may be set as available (e.g., not busy).

At block 618, determination operation is performed to determine if the pipeline is stalled. If yes/true, the write operation may be stalled (e.g., a wait time set), as in block 620. Following the wait time (e.g., one processor cycle), the method 600 moves from block 620 back to block 618.

If no/false at block 618, the write operation may be formed and the functionality 600 may end/exit (e.g., all ports finished writing), as in block 622.

Figure 7:
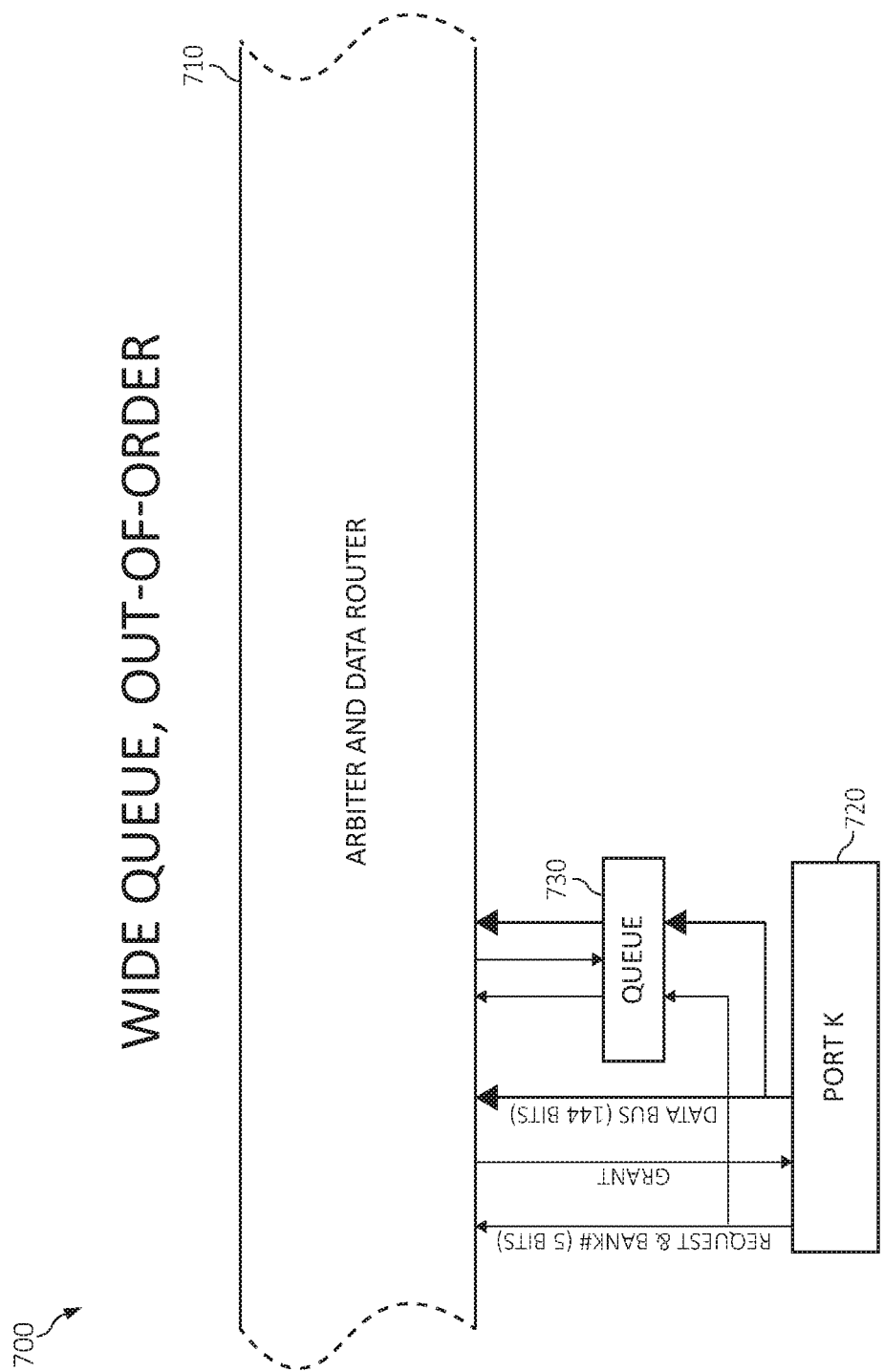
FIG. 7 is an additional block diagram depicting a multiport banked memory array using an arbiter and data router with a single queue in which aspects of the present invention may be realized.

In an additional aspect, a queue component may also be introduced to address the disadvantages discussed in FIG. 4. Turning now to FIG. 7, an arbiter and data router with a single queue may be used in a multiport banked memory array such as, for example, the multiport banked memory array 400 of FIG. 4. Repetitive description of like elements, components, modules, services, applications, and/or functions employed in other embodiments described herein (e.g., FIGS. 1-6) is omitted for sake of brevity.

In one aspect, FIG. 7 depicts an arbiter and data router 710, one or more memory ports 720 (e.g., "port K" or memory ports 0 through 6 of FIG. 4), and/or a single queue 730 (e.g., a queue component). That is, FIG. 7 depicts exemplary logic that illustrates that memory ports (e.g., port K) with lower numbers may have a higher priority according to a selected priority and access protocol and may write first to the banked memory of the multiport banked memory array of FIG. 4. When a bank conflict arises, the arbiter and data router 710 may stall a data processing pipeline so that the writes that are unable to complete in a current cycle may be retried in the next cycle. When there are no bank conflicts all 8 writes (e.g., data writes 0-7 of FIG. 4) may complete in the same cycle. Thus, once a request is placed in the queue 730, the request may be handled according to one or more operations of FIGS. 6 and/or 8.

Thus, the present invention provides a banked memory (e.g., the multiport banked memory array 400 of FIG. 4), which may have a hash table used for fast searching of items of interest) and one or more write operations may be delayed without reducing the accuracy of the results (the hash hit rate), as illustrated in FIGS. 5-8.

Accordingly, a write request queue (e.g., queue 730) may be implemented next to a requesting port (e.g., port K 720), as illustrated in FIG. 7. When the write request cannot be satisfied because of a bank conflict, the processing pipeline is not stalled but, rather, the request may be queued in queue 730.

In one aspect, in a next cycle (e.g., time cycle/processor cycle), a new write request to the same port (e.g., requesting port (e.g., port K 720)) will arrive. Now, there are 2 write requests, the current one and the queued one. If both requests may be serviced, then they are serviced in the current processor cycle. If the queued request can be serviced but the current request is unable to be serviced (because of a bank conflict), then the current request may replace the queued request in the queue 730. If the current request can be serviced but the queued request is unable to be serviced, then the queued request may remain queued in the queue 730 (therefore the write requests may proceed/execute/go out of order such as, for example, a last write request may be processed before the first write request which is acceptable in this application).

In all three scenarios, the data pipeline is not delayed thereby wasting no cycles. It should be noted that the only scenario when a pipeline must be stalled is when both the current request and the queued request have bank conflicts.

Figure 8:
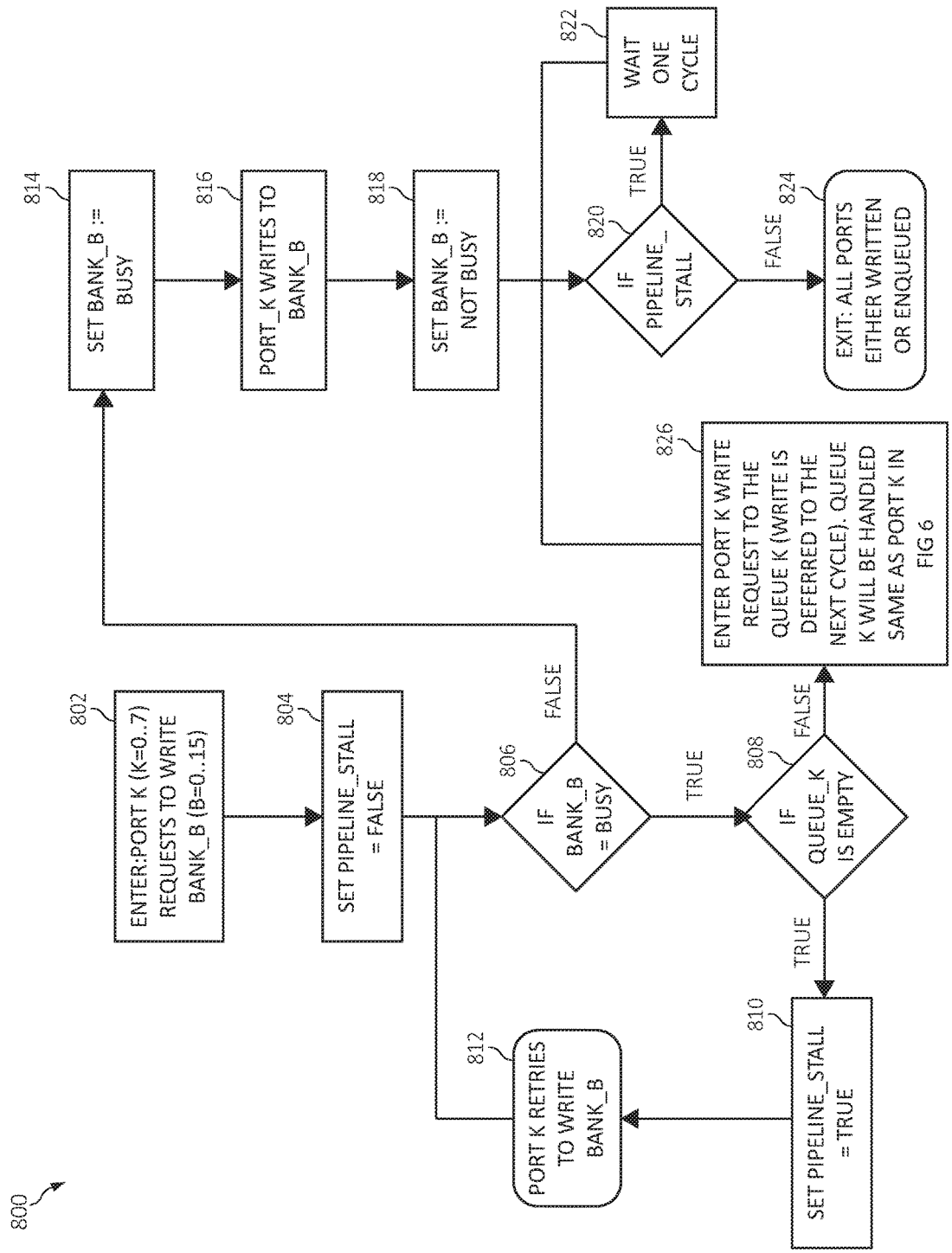
FIG. 8 is a flowchart diagram depicting an exemplary method for prioritizing access requests using a queue in a multiport banked memory array using an arbiter and data router in a computing system in which aspects of the present invention may be realized.

Turning now to FIG. 8, a flowchart diagram depicts an exemplary method 800 for prioritizing access requests using a queue in a multiport banked memory array using an arbiter and data router in a computing system. The functionality 800 may be implemented as a method executed as instructions on a machine, where the instructions are included on at least one computer readable medium or on a non-transitory machine-readable storage medium.

The functionality 800 may start in block 802 by receiving a request to write to a selected memory bank (e.g., port K (K is equal to 0 through 7) requests access to bank B where B is equal to 0 through 15 such as in FIGS. 4 and 5). A pipeline stall may be set as "false," as in block 804. A determination operation is performed to determine if the selected memory bank (e.g., bank B) is busy/unavailable, as in block 806. If yes/true, the method 800 moves to block 808 and determines if a queue component (e.g., queue K, where K is a positive integer or selected value such as, for example, K is equal to one). If no/false in block 808, the method 800 moves to block 826 and a memory port (e.g., port K) may place/enter the write request into the queue component (e.g., write request may be deferred to a next cycle/processing cycle). The queue may be handled similar to the memory port (e.g., port K of FIG. 6). From block 826, the method may move to block 822 and wait one cycle.

If yes/true at block 808, the pipeline stall may be set as true (e.g., busy/unavailable), as in block 810. From block 810, the memory port (e.g., port K) attempts to retry to write to the selected memory bank (e.g., bank B) for a selected number of cycles, as in block 812. From block 812, the method 800 moves back to block 806.

Returning now to block 806, if no (e.g., false) at block 806, the selected memory bank (e.g., bank B) may be set as busy/unavailable, as in block 814. At block 816, the memory port (e.g., port K) may write to the selected memory bank (e.g., bank B). At block 818, the selected memory bank (e.g., bank B) may be set as available (e.g., not busy).

At block 820, a determination operation is performed to determine if the pipeline is stalled. If yes/true at block 820, the write operation may be stalled (e.g., a wait one cycle), as in block 822. Following the wait cycle (e.g., one processor cycle), the method 800 moves from block 822 back to block 820.

If no/false at block 820, the write operation may be formed and the functionality 800 may end/exit (e.g., all ports finished writing), as in block 824.

Figure 9:
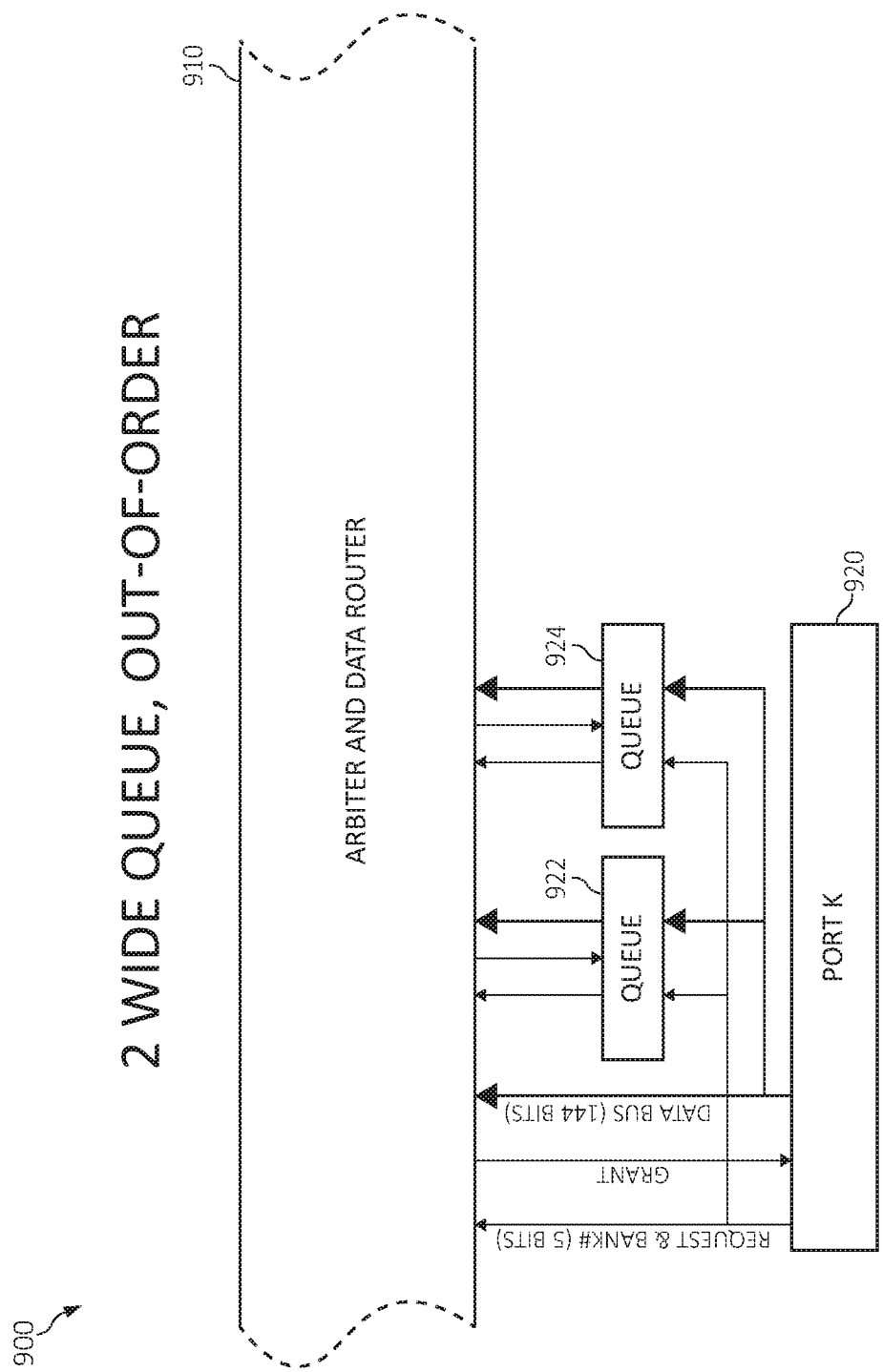
FIG. 9 is an additional block diagram depicting a multiport banked memory array using an arbiter and data router with multiple queues in which aspects of the present invention may be realized.

Turning now to FIG. 9, diagram 900 depicts an arbiter and data router with multiple queues used in a multiport banked memory array such as, for example, the multiport banked memory array 400 of FIG. 4. Repetitive description of like elements, components, modules, services, applications, and/or functions employed in other embodiments described herein (e.g., FIGS. 1-6) is omitted for sake of brevity.

In one aspect, FIG. 9 depicts an arbiter and data router 910, one or more memory ports 920 (e.g., "port K" or memory ports 0 through 6 of FIG. 4), and/or a first queue 922 and a second queue 924 (e.g., a queue component). That is, FIG. 9, similar to FIG. 7, depicts exemplary logic that illustrates that memory ports (e.g., port K) with lower numbers may have a higher priority according to a selected priority and access protocol and may write first to the banked memory of the multiport banked memory array of FIG. 4. When a bank conflict arises, the arbiter and data router 910 may stall the data processing pipeline so that the writes that are unable to complete in a current cycle may be retried in the next cycle. When there are no bank conflicts all 8 writes (e.g., data writes 0-7 of FIG. 4) may complete in the same cycle. Thus, once a request is placed in the queue 922 or 924, the request may be handled according to one or more operations of FIGS. 6 and/or 8.

Accordingly, a write request queue (e.g., queue 922 and/or 924) may be implemented next to a requesting port (e.g., port K 920), as illustrated in FIG. 9. When the write request cannot be satisfied because of a bank conflict, the processing pipeline is not stalled but, rather, the request may be queued in the first queue 922 or the second queue 924.

It should be noted that the additional queued requests going in to the arbiter and data router 910 may increase the circuit wiring complexity. For example, in the two queue (e.g., the first queue 922 or the second queue 924) slots per port, there may be 3 times as many wires going in to the first queue 922 or the second queue 924 compared to the baseline (e.g., system 400 of FIG. 4).

Figure 10:
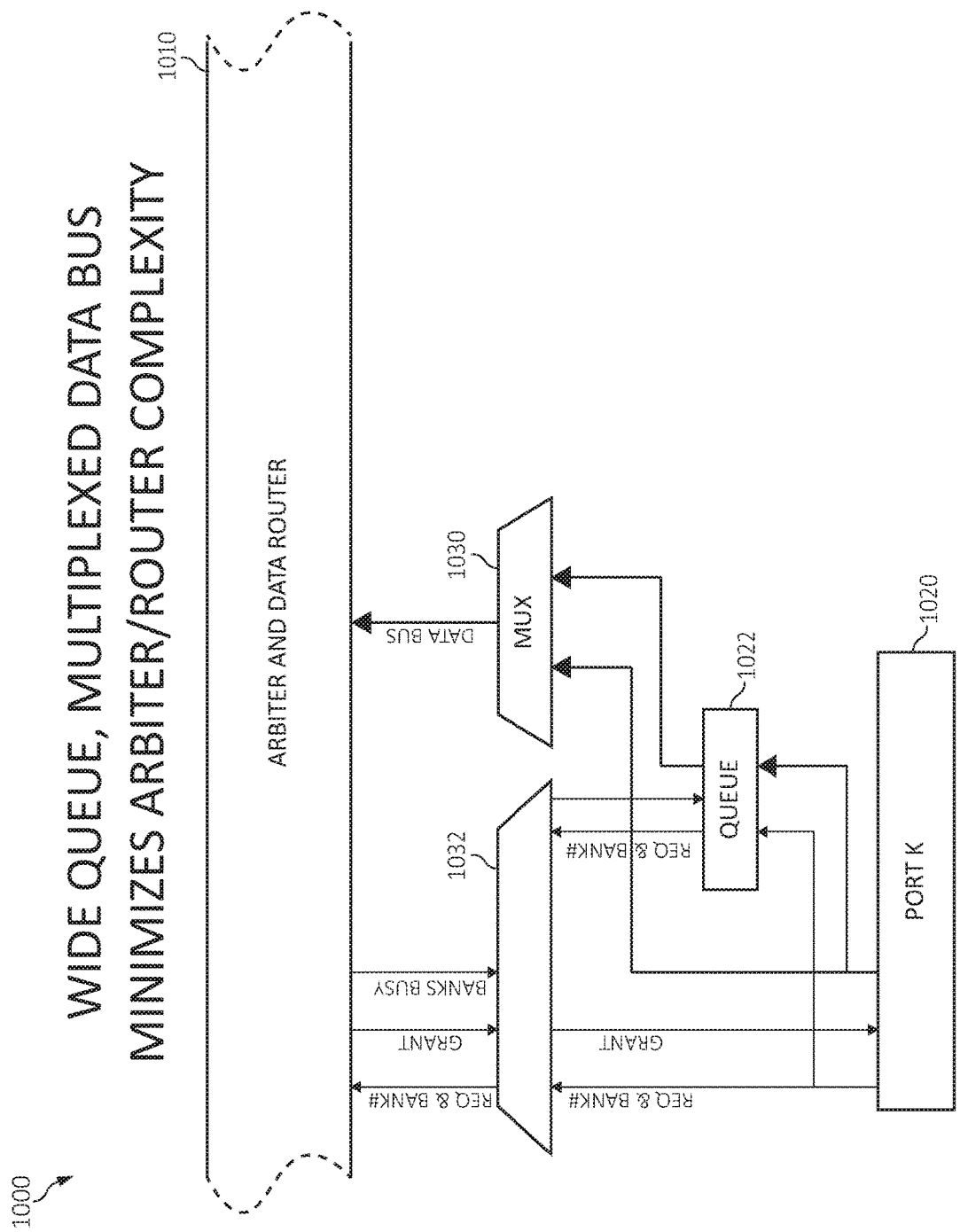
FIG. 10 is an additional block diagram depicting a multiport banked memory array using an arbiter and data router with a single queue and a multiplexed data bus in which aspects of the present invention may be realized.

To address the increase in wiring challenge, the present invention may implement a data multiplexer ("MUX") as illustrated in FIG. 10. That is, FIG. 10 depicts a multiport banked memory array such as, for example, the multiport banked memory array 400 of FIG. 4, using an arbiter and data router 1010 with a single queue 1022 and a multiplexed data bus 1030 and/or 1032 (e.g., the MUX). The arbiter and data router 1010 may be used to decide between a current request or a queued request thereby either request may be made available to the arbiter and data router 1010. The response from the arbiter and data router 1010 may be used to select the data using a MUX select (e.g., MUX 1030 and 1032).

In one aspect, the MUX 1030 and 1032 may be a 2 to 1 funnel: either a current request or the queued request may be written to the memory array but not both in the same cycle, even when the two target banks are both available. In one aspect, the arbiter and data router 1010 may still receive both write requests but the arbiter and data router 1010 can only allow one request. When the data is MUXed in MUX 1030, 1.16 cycle time increases to 1.26 in FIG. 10 (1 wide queue, muxed bus, out of order).

Figure 11:
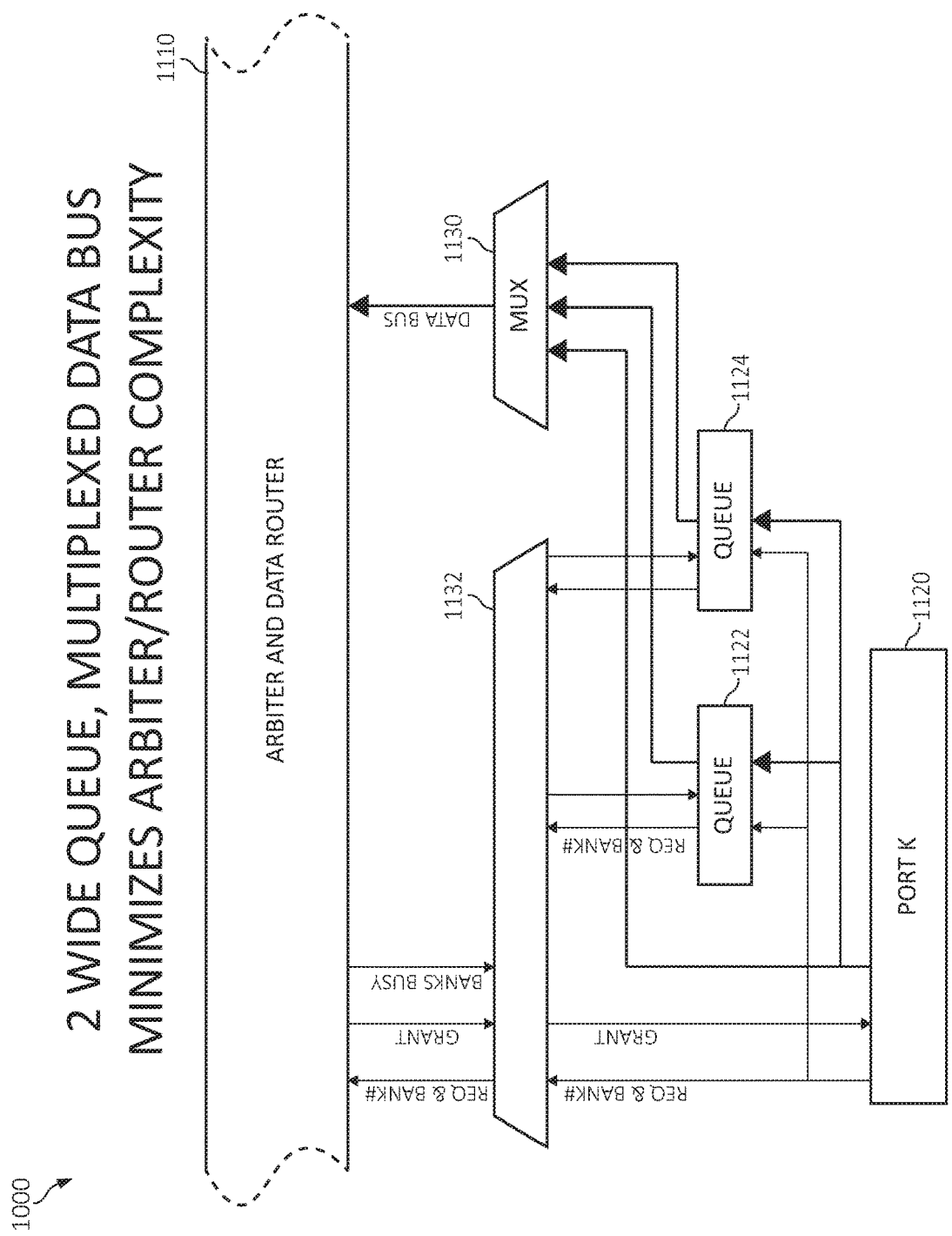
FIG. 11 is an additional block diagram depicting a multiport banked memory array using an arbiter and data router with multiple queues and a multiplexed data bus in which aspects of the present invention may be realized.

Similar to FIG. 10, in FIG. 9 is converted to FIG. 11 by muxing data using MUX 1130. That is, two queues 1122 and 1124 may be used along with MUX's 1130 and 1132. However, given the additional components the performance decreases in efficiency up from 1.02 cycles to 1.12 cycles, as illustrated in FIG. 12. The reason for degradation in performance is because only one write can succeed per port such as, for example, allowing one of the queued requests or allowing a current request. Therefore, the probability of queue fullness increases and hence a stall probability increases. It should be noted that depending on the application, an administrator may be defined in-order writes such that by using a single queue the multiplexed data bus case's cycle time increases from 1.26 to 1.45 cycles. Thus, the administrator may accept the trade-off or increase the number queue elements.

By way of illustration and example only, by using the components and structures described herein, FIG. 12 depicts table 1200 illustrating the results from minimizing conflict in a multiport banked memory array.

For example, FIG. 12 depicts the average cycle time (e.g., avg. cycles/group where 1.0 is a standard/optimal cycle time) for both a multiport banked memory array with 16 banks and 8 requests per group and 32 banks and 8 requests per group.

That average cycle time are depicted for only an arbiter and data router ("no queue" out-of-order requests of FIG. 5), a single queue, out-of-order requests of FIG. 7, a dual queue, out-of-order requests of FIG. 9, a single queue and multiplexed data bus, out-of-order requests of FIG. 10, a dual queue and multiplexed data bus, out-of-order requests of FIG. 11, and a single queue and multiplexed data bus, in-order requests of FIG. 10.

For example, the simulations illustrate that the pipeline speed increase from 2.06 cycles per request group to 1.16 cycles per group (e.g., from no queue of FIG. 5 to a single queue of FIG. 7) as shown in FIG. 12, where 1.0 is the ideal cycle time (e.g., there are no stalls). Such increase in efficiency results from the probability of a conflict is diminished/decreased by using one or more retry operations as described herein and eventually the queued request will be able to access an available bank therefore the write will succeed.

In the 16 banks 8 write ports scenario, a 1 entry queue per port is sufficient to substantially reduce the number of stalls. Even higher performance is possible when the queue size is increased to 2 queues as shown in FIG. 9. In this case, the average cycle time reduces to 1.02 which is near ideal. The 1.02 cycles result also implements the out-of-order policy: the queued requests may be scanned from left to right (e.g., the first queued first) and finally the current request. A write request may be written upon finding an available memory bank. If the current request is unable to be written and if any of the two queue slots are available, the current request will be written to that particular queue slot. Other queueing policies may be implemented such as insisting on in-order writes.

Figure 13:
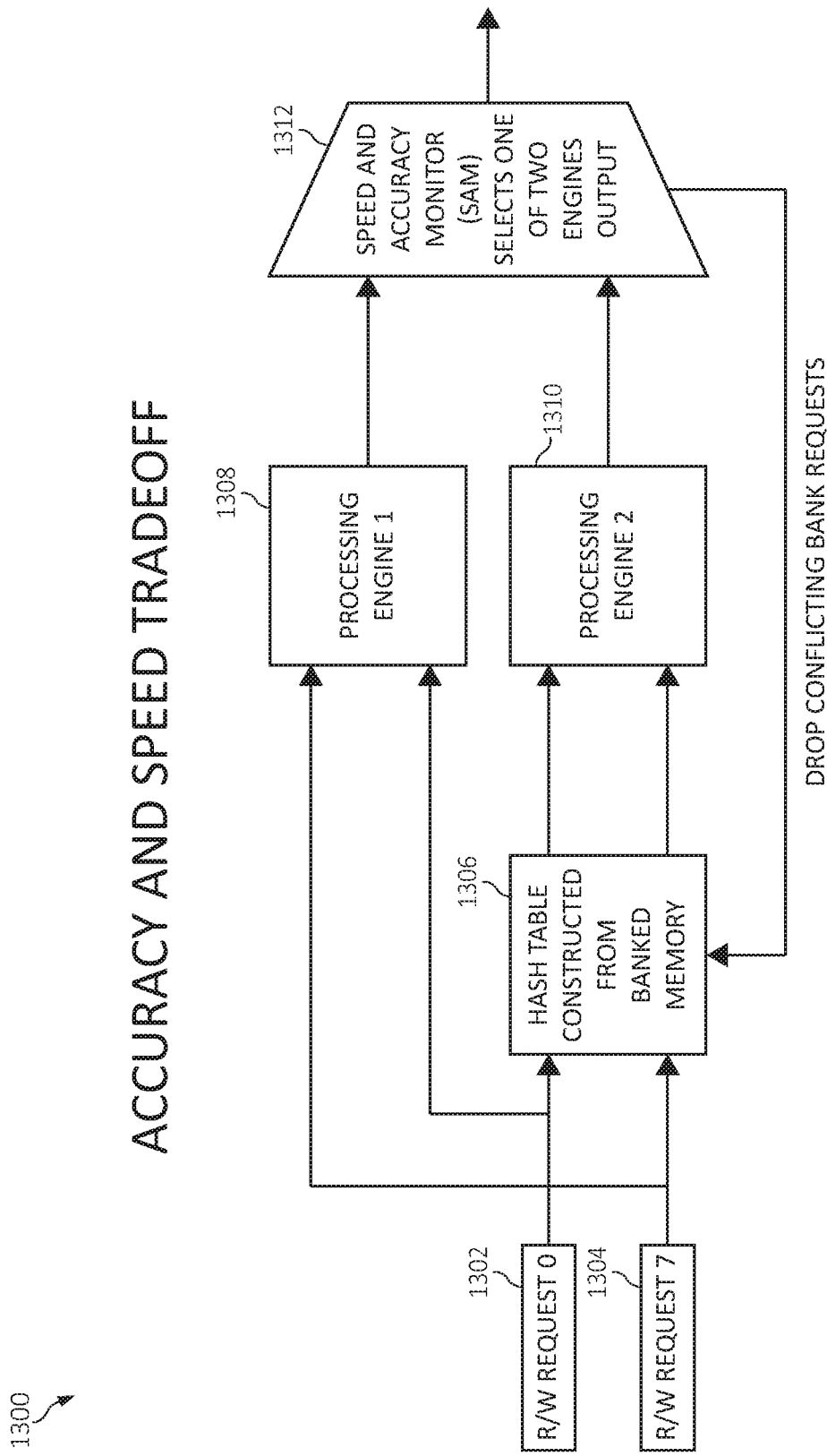
FIG. 13 is an additional block diagram depicting managing speed and accuracy of access to the multiport banked memory array in which aspects of the present invention may be realized.

In one aspect, a user of the multiport memory may be enabled to select/choose to dynamically alter the speed of the pipeline and change the accuracy of the results (e.g., the hash table.). Turning now to FIG. 13 is a block diagram 1300 depicts managing speed and accuracy of access to the multiport banked memory array (e.g., the multiport banked memory array system 400).

In one aspect, a speed and accuracy monitor (SAM) 1312 may be enabled and associated with the multiport banked memory array system 400 of FIG. 4 and continuously measure the speed and accuracy of the results. When a higher/faster speed is required, the SAM 1312 may send a command to the multiport banked memory array system 400 that a conflicting access requests may be dropped. When higher accuracy is required, SAM 1312 may send a command that all conflicting requests must be satisfied at the expense of a slower pipeline.

In one aspect, the SAM 1312 may be residing in a processing engine that may comprise two separate processing engines such as, for example, processing engine 1, 1308 and processing engine 2, 1310. The two engines (e.g., processing engine 1 1308 and processing engine 2 1310) may operate in a tournament fashion where each one separately computes a partial result of a read/write ("R/W") request 0 1302 and/or R/W request 7 1304 and the better of the two partial results may be selected and written to the output. The tournament processing yields a better/increased/ more efficient overall output compared to a single processing engine operating alone. It should be noted that "better" may be defined as smaller or a more accurate result. In one aspect, the processing engine 2, 1310 may use the multiport memory and processing engine 1, 1308 does not use the memory 1306 (e.g., hash table constructed form a banked memory). If the results of and processing engine 1, 1308 are substantially selected, then the SAM 1312 may send a "drop conflicting bank requests" signal to the memory 1306 (e.g., multiport banked memory array system 400 of FIG. 4) because there is no need to stall the processing as the processing engine 2, 1310 results are not being used. In the same manner, if higher speed is needed, the drop signal may still be sent.

Figure 14:
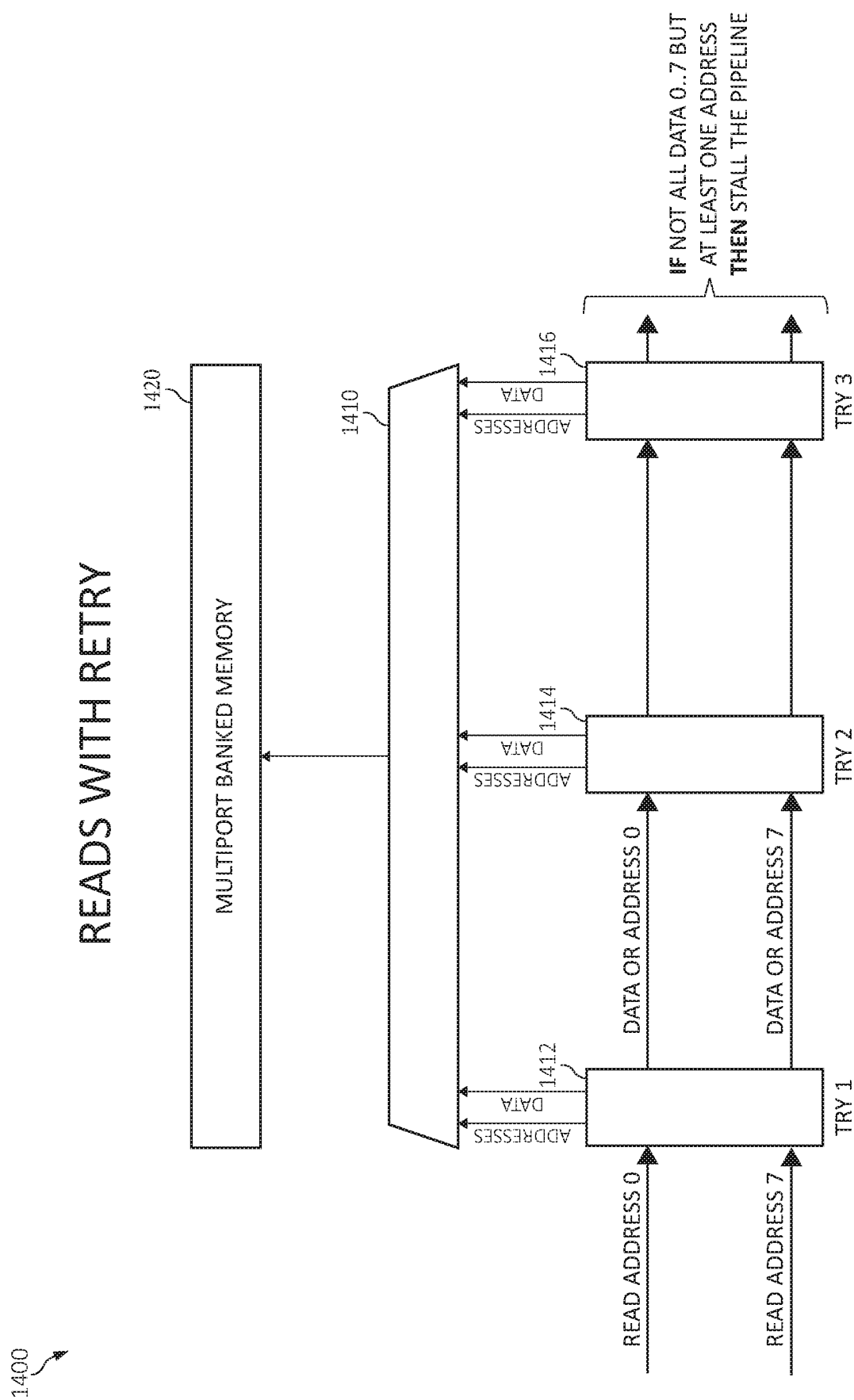
FIG. 14 is an additional block diagram depicting retrying a read request for access to the multiport banked memory array in which aspects of the present invention may be realized and FIG. 15 is a flowchart diagram depicting an exemplary method for minimizing conflict in a multiport banked memory array using an arbiter and data router in a multiport banked memory array in a computing system in which aspects of the present invention may be realized.

Turning now to FIG. 14, block diagram 1400 depicts retrying a read request for access to the multiport banked memory array 1420. In some applications of a multiport banked memory 1420 (e.g., the multiport banked memory array system 400 of FIG. 4), one or more read requests may be pipelined. In other words, a read request may be issued, but it is acceptable to have the data back few cycles later. That is, FIG. 14 depicts a 3-cycle read implementation (e.g., try 1 in a first pipeline 1412, try 2 in a second pipeline 1414, and/or try 3 in a third pipeline 1416).

In one aspect, the read requests may flow from left to right. Each of the 8 ports send a read address (e.g., read address 0 through read address 7) to the multiport banked memory 1420 such as, for example, an arbiter and data router 1410. In one aspect (e.g., a best/optimal scenario), with no conflicts, all 8 read request may be satisfied. However, with the presence of one or more bank conflicts, only some of the read requests may be filled. The filled requests are latched replacing the addresses and the group of 8 to the second stage 1414. The remaining unfilled read addresses may be sent to the multiport banked memory array 1420. The successful read request may be latched again, and the result forwarded to the third stage 1416. If there is still an outstanding request at the end of the third stage 1416, then the pipeline may be stalled. Also, using the present invention increases the probability that all 8 requests may be satisfied at the end of the third stage 1416. However, depending on the number of memory banks and ports, fewer or larger number of stages may be required.

Figure 15:
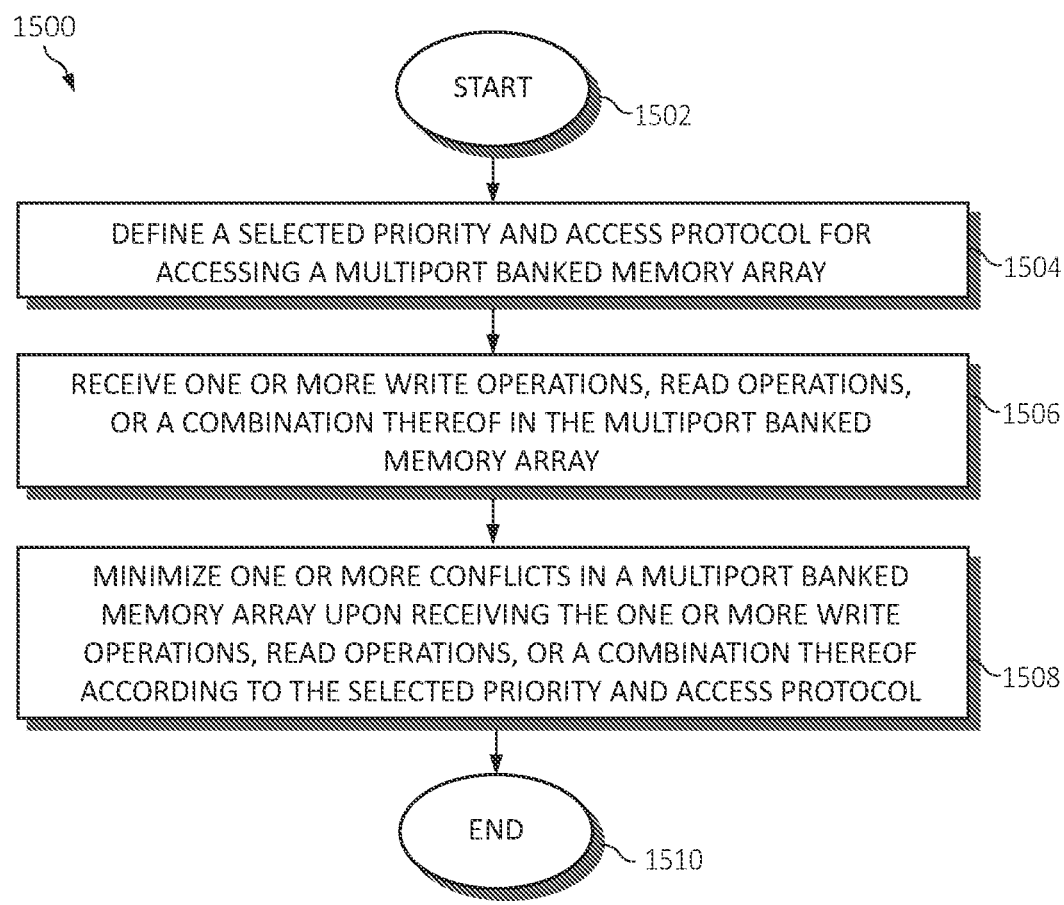

Turning now to FIG. 15, a method 1500 for minimizing conflict in a multiport banked memory array using an arbiter and data router in a multiport banked memory array is depicted, in which various aspects of the illustrated embodiments may be implemented. The functionality 1500 may be implemented as a method executed as instructions on a machine, where the instructions are included on at least one computer readable medium or on a non-transitory machine-readable storage medium.

The functionality 1500 may start in block 1502. A selected priority and access protocol may be defined for accessing a multiport banked memory array, as in block 1504. One or more write operations, read operations, or a combination thereof may be received in a multiport banked memory array, as in block 1506. One or more conflicts may be eliminated in a multiport banked memory array upon receiving one or more write operations, read operations, or a combination thereof according to a selected priority and access protocol, as in block 1508. The functionality 1500 may end in block 1510.

In one aspect, in conjunction with and/or as part of at least one block of FIG. 15, the operation of method 1500 may include each of the following. The operation of functionality 1500 may manage access to one or more target memories in the multiport banked memory array for the one or more write operations, read operations, or a combination thereof using a hash table, a speed and access monitor, an arbiter and router, or a combination thereof according to the selected priority and access protocol.

The operation of functionality 1500 may queue the one or more write operations, read operations, or a combination thereof to a memory in the multiport banked memory array according the selected priority and access protocol.

The operation of functionality 1500 may grant simultaneous access to one or more target memories in the multiport banked memory array for a current write request and a queued write request according the selected priority and access protocol, and/or grant access to one or more target memories in the multiport banked memory array for a current write request or one of a plurality of queued write requests in one or more queues according the selected priority and access protocol.

The operation of functionality 1500 may grant access to the target memory for a queued write request while queuing the current write request according the selected priority and access protocol or grant access to the target memory for the current write request while retaining the queued write request in a queue according the selected priority and access protocol.

The operation of functionality 1500 may place the one or more write operations, read operations, or a combination thereof in a pipeline for accessing one or more target memories in the multiport banked memory array, and/or dynamically adjust a speed in the pipeline dropping, stalling, and/or retrying the one or more write operations, read operations, or a combination thereof for access to the one or more target memories.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method, by a processor, for data storage, comprising:
processing data handling in a multiport banked memory array upon receiving one or more write operations, read operations, or a combination thereof according to a selected priority and access protocol, wherein access to one or more target memories in the multiport banked memory array is managed by an arbiter and router that retry requests to access the one or more target memories a predetermined number of times prior to stalling a memory pipeline in lieu of using a queue to maintain the requests to access the one or more target memories; and
dynamically adjusting a speed of processing the one or more write operations, read operations, or the combination thereof in the memory pipeline using a speed and accuracy monitor implemented within a processing engine associated with the multiport banked memory array, wherein the speed and accuracy monitor continuously samples the speed of processing and an accuracy of processing results, and dynamically adjusts the speed of processing by commanding conflicting requests to access the one or more target memories be satisfied or dropped according to an accuracy necessitated by a current memory operation.

2. The method of claim 1, wherein managing the access to the one or more target memories in the multiport banked memory array for the one or more write operations, read operations, or a combination thereof further includes using a hash table, or a combination thereof according to the selected priority and access protocol.

3. The method of claim 1, further including queuing the one or more write operations, read operations, or a combination thereof to a memory in the multiport banked memory array according the selected priority and access protocol.

4. The method of claim 1, further including granting simultaneous access to one or more target memories in the multiport banked memory array for a current write request and a queued write request according the selected priority and access protocol.

5. The method of claim 1, further including granting access to one or more target memories in the multiport banked memory array for a current write request or one of a plurality of queued write requests in one or more queues according the selected priority and access protocol.

6. The method of claim 1, further including:
receiving a current write request to a target memory in the multiport banked memory array;
granting access to the target memory for a queued write request while queuing the current write request according the selected priority and access protocol; or
granting access to the target memory for the current write request while retaining the queued write request in a queue according the selected priority and access protocol.

7. A system for data storage, comprising:
one or more computers with executable instructions that when executed cause the system to:
process data handling in a multiport banked memory array upon receiving one or more write operations, read operations, or a combination thereof according to a selected priority and access protocol, wherein access to one or more target memories in the multiport banked memory array is managed by an arbiter and router that retry requests to access the one or more target memories a predetermined number of times prior to stalling a memory pipeline in lieu of using a queue to maintain the requests to access the one or more target memories; and
dynamically adjust a speed of processing the one or more write operations, read operations, or the combination thereof in the memory pipeline using a speed and accuracy monitor implemented within a processing engine associated with the multiport banked memory array, wherein the speed and accuracy monitor continuously samples the speed of processing and an accuracy of processing results, and dynamically adjusts the speed of processing by commanding conflicting requests to access the one or more target memories be satisfied or dropped according to an accuracy necessitated by a current memory operation.

8. The system of claim 7, wherein managing the access to the one or more target memories in the multiport banked memory array for the one or more write operations, read operations, or a combination thereof further includes using a hash table, or a combination thereof according to the selected priority and access protocol.

9. The system of claim 7, wherein the executable instructions queue the one or more write operations, read operations, or a combination thereof to a memory in the multiport banked memory array according the selected priority and access protocol.

10. The system of claim 7, wherein the executable instructions grant simultaneous access to one or more target memories in the multiport banked memory array for a current write request and a queued write request according the selected priority and access protocol.

11. The system of claim 7, wherein the executable instructions grant access to one or more target memories in the multiport banked memory array for a current write request or one of a plurality of queued write requests in one or more queues according the selected priority and access protocol.

12. The system of claim 7, wherein the executable instructions:
- receive a current write request to a target memory in the multiport banked memory array;
- grant access to the target memory for a queued write request while queuing the current write request according the selected priority and access protocol; or
- grant access to the target memory for the current write request while retaining the queued write request in a queue according the selected priority and access protocol.

13. A computer program product for data storage by a processor, the computer program product comprising a non-transitory computer-readable storage medium having computer-readable program code portions stored therein, the computer-readable program code portions comprising:
- an executable portion that process data handling in a multiport banked memory array upon receiving one or more write operations, read operations, or a combination thereof according to a selected priority and access protocol, wherein access to one or more target memories in the multiport banked memory array is managed by an arbiter and router that retry requests to access the one or more target memories a predetermined number of times prior to stalling a memory pipeline in lieu of using a queue to maintain the requests to access the one or more target memories; and
- an executable portion that dynamically adjusts a speed of processing the one or more write operations, read operations, or the combination thereof in the memory pipeline using a speed and accuracy monitor implemented within a processing engine associated with the multiport banked memory array, wherein the speed and accuracy monitor continuously samples the speed of processing and an accuracy of processing results, and dynamically adjusts the speed of processing by commanding conflicting requests to access the one or more target memories be satisfied or dropped according to an accuracy necessitated by a current memory operation.

14. The computer program product of claim 13, wherein managing the access to the one or more target memories in the multiport banked memory array for the one or more write operations, read operations, or a combination thereof further includes using a hash table, or a combination thereof according to the selected priority and access protocol.

15. The computer program product of claim 13, further including an executable portion that queues the one or more write operations, read operations, or a combination thereof to a memory in the multiport banked memory array according the selected priority and access protocol.

16. The computer program product of claim 13, further including an executable portion that:
- grants simultaneous access to one or more target memories in the multiport banked memory array for a current write request and a queued write request according the selected priority and access protocol; or
- grants access to one or more target memories in the multiport banked memory array for the current write request or one of a plurality of queued write requests in one or more queues according the selected priority and access protocol.

17. The computer program product of claim 13, further including an executable portion that:
- receives a current write request to a target memory in the multiport banked memory array;
- grants access to the target memory for a queued write request while queuing the current write request according the selected priority and access protocol; or
- grants access to the target memory for the current write request while retaining the queued write request in a queue according the selected priority and access protocol.

* * * * *